(12) United States Patent
Appenzeller et al.

(10) Patent No.: US 9,041,440 B2
(45) Date of Patent: May 26, 2015

(54) GRAPHENE-BASED FREQUENCY TRIPLER

(71) Applicant: Purdue Research Foundation, West Lafayette, IN (US)

(72) Inventors: Joerg Appenzeller, West Lafayette, IN (US); Hong-yan Chen, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 14/195,843

(22) Filed: Mar. 3, 2014

(65) Prior Publication Data

US 2014/0292381 A1   Oct. 2, 2014

Related U.S. Application Data

(60) Provisional application No. 61/771,397, filed on Mar. 1, 2013.

(51) Int. Cl.
| | | |
|---|---|---|
| *H03B 19/00* | (2006.01) | |
| *H01L 29/16* | (2006.01) | |
| *H01L 27/092* | (2006.01) | |
| *H03B 19/14* | (2006.01) | |

(52) U.S. Cl.
CPC .......... *H01L 29/1606* (2013.01); *H01L 27/092* (2013.01); *H03B 19/14* (2013.01)

(58) Field of Classification Search
USPC ...................... 327/113–122, 355–361, 39–49, 327/365–508; 477/47, 48; 455/323–330
See application file for complete search history.

(56) References Cited

U.S. PATENT DOCUMENTS

| | | | | |
|---|---|---|---|---|
| 8,432,149 | B2* | 4/2013 | Levine | 324/71.5 |
| 8,487,790 | B2* | 7/2013 | Fife et al. | 341/101 |
| 2001/0040479 | A1* | 11/2001 | Zhang | 327/427 |
| 2010/0244929 | A1* | 9/2010 | Jalbout et al. | 327/427 |
| 2011/0260774 | A1* | 10/2011 | Granger-Jones et al. | 327/427 |
| 2012/0161850 | A1* | 6/2012 | Rangarajan et al. | 327/427 |
| 2012/0169398 | A1* | 7/2012 | Brindle et al. | 327/434 |
| 2014/0043094 | A1* | 2/2014 | Yamazaki et al. | 327/437 |
| 2014/0184309 | A1* | 7/2014 | Steeneken et al. | 327/434 |

OTHER PUBLICATIONS

J.-H. Chen, C. Jang et al., Charged-Impurity Scattering in Graphene, Nature Physics, Apr. 2008, pp. 377-381, vol. 4, No. 5.
D. Berdebes et al., Substrate Gating of Contact Resistance in Graphene Transistors, IEEE Transactions on Electron Devices, Nov. 2011, pp. 3925-3932, vol. 58, No. 11.
Y. Sui et al., Signatures of Disorder in the Minimum Conductivity of Graphene, Nano letters, Mar. 2011, pp. 1319-1322, vol. 11, No. 3.

(Continued)

*Primary Examiner* — Brandon S Cole
(74) *Attorney, Agent, or Firm* — Maginot, Moore & Beck, LLP

(57) ABSTRACT

A frequency tripler device is disclosed. The frequency tripler device includes a first graphene based field effect transistor (FET) of a first dopant type, having a gate, a drain, and a source, and a second graphene based FET of a second dopant type, having a gate, a drain, and a source, the gate of the first FET coupled to the gate of the second FET and coupled to an input signal having an alternating current (AC) signal of a first frequency, the combination of the first and second FETs generates an output signal with a dominant AC signal of a frequency of about three times the first frequency.

15 Claims, 6 Drawing Sheets

(56) References Cited

OTHER PUBLICATIONS

H. Wang et al., Doping Monolayer Graphene with Single Atom Substitutions, Nano letters, Jan. 2012, pp. 141-144, vol. 12, No. 1.

W. J. Yu et al., Toward Tunable Band Gap and Tunable Dirac Point in Bilayer Graphene with Molecular Doping, Nano Letters, Nov. 2011, pp. 4759-4763, vol. 11, No. 11.

H. Liu et al., Chemical Doping of Graphene, Journal of Materials Chemistry, 2011, pp. 3335, vol. 21, No. 10.

H. Y. Chen et al., Complementary-Type Graphene Inverters Operating at Room-Temperature, Device Research Conference (DRC), 2011, pp. 33-34, No. 1.

H.-Y. Chen et al., On the Voltage Gain of Complementary Graphene Voltage Amplifiers With Optimized Doping, IEEE Electron Device Letters, Oct. 2012, pp. 1462-1464, vol. 33, No. 10.

J. R. Williams et al., Quantum Hall Effect in a Gate-Controlled p-njunction of Graphene, Science (New York, N.Y.), Aug. 2007, pp. 638-641, vol. 317, No. 5838.

Z. Chen et al., An Integrated Logic Circuit Assembled on a Single Carbon Nanotube, Science (New York, N.Y.), Mar. 2006, pp. 1735, vol. 311, No. 5768.

H.-Y. Chen et al., Graphene-Based Frequency Tripler, Nano Letters, Mar. 2012, pp. 2067-2070, vol. 12, No. 4.

H. Wang et al., Graphene Frequency Multipliers, IEEE Electron Device Letters, May 2009, pp. 547-549, vol. 30, No. 5.

H. Wang et al., Gigahertz Ambipolar Frequency Multiplier Based on CVD Graphene, International Electron Devices Meeting (IEDM) 2010, pp. 23.6.1-23.6.4.

\* cited by examiner

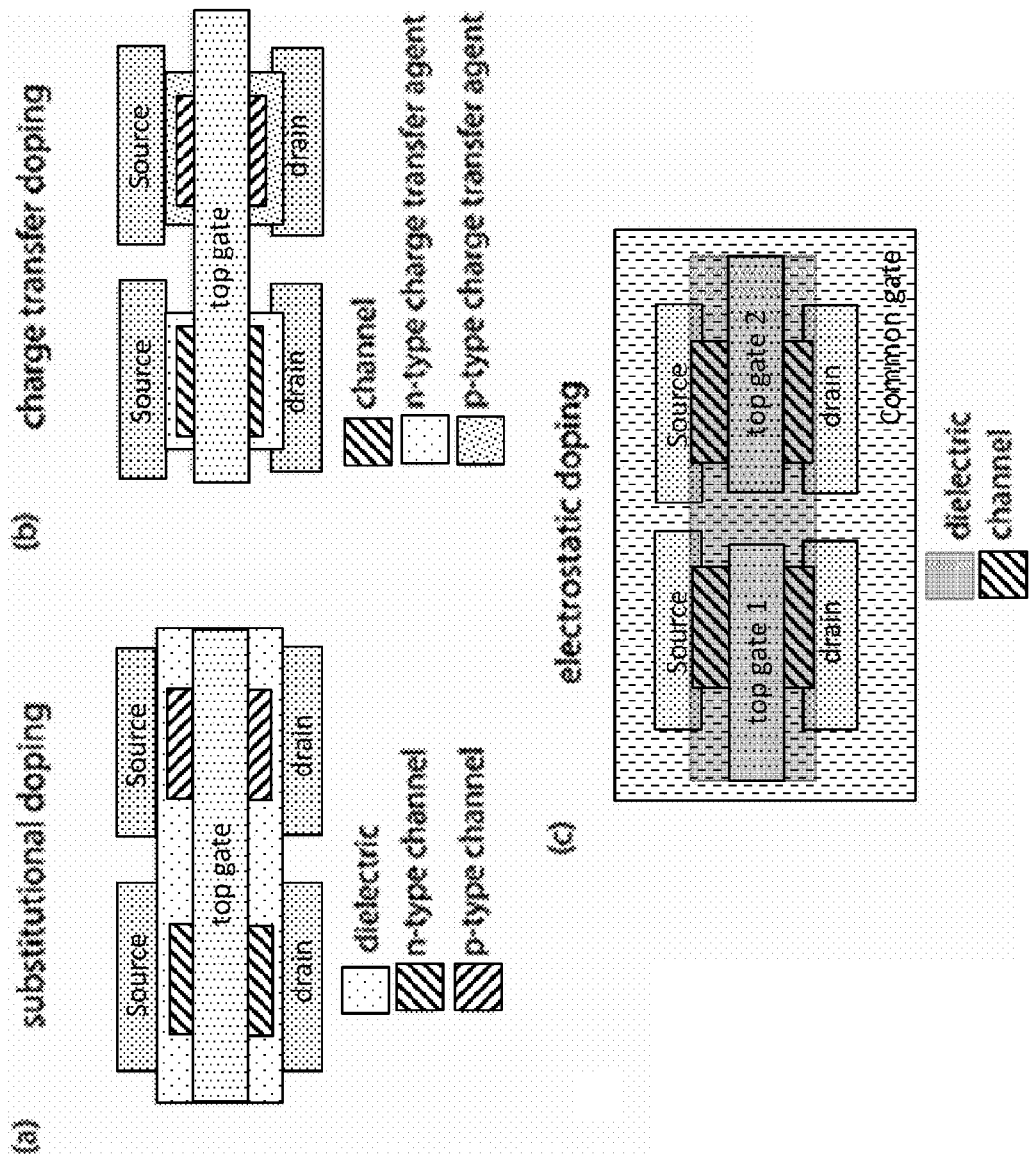
FIGs. 2a, 2b, and 2c

GRAPHENE-BASED FREQUENCY TRIPLER

CROSS-REFERENCE TO RELATED APPLICATIONS

The present U.S. patent application is related to and claims the priority benefit of U.S. Provisional Patent Application Ser. No. 61/771,397, filed Mar. 1, 2013, the contents of which are hereby incorporated by reference in its entirety into the present disclosure.

TECHNICAL FIELD

The present disclosure generally relates to electronic circuits, and in particular to a frequency multiplier block and structures associated therewith.

BACKGROUND

This section introduces aspects that may help facilitate a better understanding of the disclosure. Accordingly, these statements are to be read in this light and are not to be understood as admissions about what is or is not prior art While graphene's excellent electrical properties, i.e., high mobility, has attracted a great deal of interest in the scientific community, the apparent absence of a bandgap for graphene has limited its application realm considerably. At the same time, it is the missing of a bandgap that provides graphene with its ambipolar device characteristics and the substantially nonexistence of a true device off-state.

As a result, some scientists have been working on how the advantageous electronic properties of graphene can be utilized while dealing appropriately with its unique characteristics rather than enforcing conventional device concepts.

Frequency multiplication is one of the common approaches for signal generation that is required in a large number of applications, e.g. digital/analog communication, terahertz radio astronomy, and remote sensing. In conventional applications, frequency multiplication is achieved through modulation of a sinusoidal signal by means of non-linear electronic components such as diodes or conventional field effect transistors (FETs). In this way harmonics at higher frequencies are generated, and the harmonic component of interest is then extracted employing appropriate filter designs. For various purposes, frequency multipliers built for all multiplication factors are desirable. However, while a frequency "doubler" is known and can be built by utilizing the nonlinear current-voltage properties of a diode, building a frequency "tripler" is more challenging and uncommon, since the modulated output signal of a conventional tripler tends to be dominated by the fundamental frequency component with relatively small power at the third harmonic frequency. The resulting poor output spectral purity (generally <15%) of the third harmonic component in turn limits the conversion efficiency resulting in complicated filter designs.

Therefore, there is an unmet need for a frequency tripler design that does not suffer from the aforementioned limitations.

SUMMARY

A frequency tripler device is disclosed. The frequency triple device includes a first graphene based field effect transistor (FET) of a first dopant type, having a gate, a drain, and a source. The frequency triple device further includes a second graphene based FET of a second dopant type, having a gate, a drain, and a source. The gate of the first FET coupled to the gate of the second FET and coupled to an input signal having an alternating current (AC) signal of a first frequency. The combination of the first and second FETs generates an output signal with a dominant AC signal of a frequency of about three times the first frequency.

BRIEF DESCRIPTION OF DRAWINGS

FIGS. 2a, 2b, and 2c depict schematics of various doping schemes (2a: substitutional doping; 2b: charge transfer doping; 2c: electrostatic doping) which may be implemented to generate two FETs such that one behaves as a p-type and one as an n-type device.

DETAILED DESCRIPTION

Figures 1A, 1B:
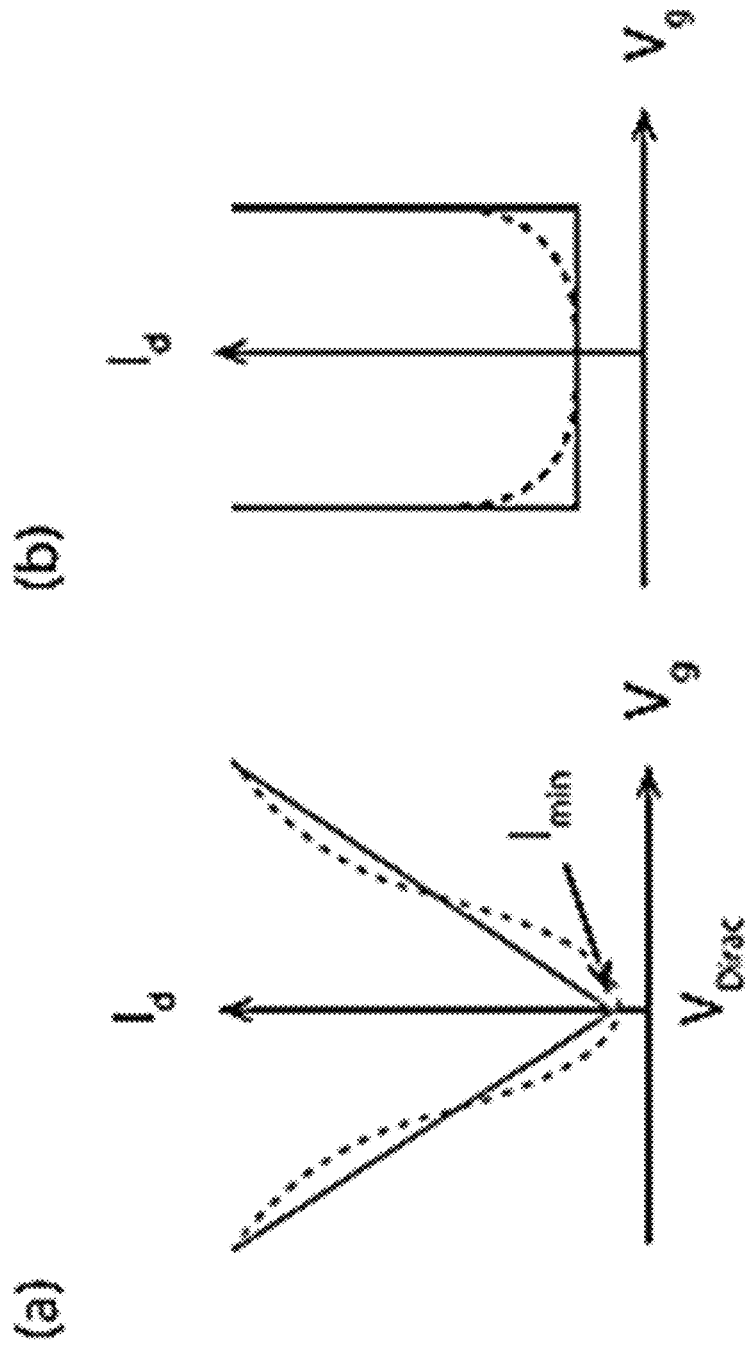
FIG. 1a is graph of current vs. voltage (I-V) depicting non-linearities in a graphene field effect transistor's (FET's) transfer characteristic and their impact on the frequency tripler and further depicting ambipolar characteristics in one graphene FET producing an approximate "V"-shape.
FIG. 1b is a graph of I-V depicting a generalized "U"-shape graph which is not desirable.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

A novel electronic graphene-based frequency tripler is disclosed. The novel tripler, innovatively takes advantage of intrinsic properties of graphene, in particular, the ambipolar behavior of graphene and further graphene's unique switching properties to provide a frequency tripler with high conversion efficiency. The frequency tripler employs a novel electrostatic doping approach. This new disclosed device construction utilizes graphene's ambipolar device properties to achieve frequency tripling in a compact two field effect transistor (FET) configuration. Experimental verification of the operation principle is provided through an electrostatic doping approach. The experimentally achieved spectral purity at an output frequency of 600 Hz is >70%, compared with <15% as generally obtained in conventional FET triplers, which is a significant improvement over existing technologies.

The non-linearity in the current-voltage (I-V) characteristic of a graphene FET is one important component to enable the frequency tripler presented in this disclosure. FIG. 1a shows the required non-linearity in a graphene FET's transfer characteristics. The solid line illustrates the desired, "V"-shaped current versus gate voltage dependence (note that the tip region shows ideally some rounded behavior), while the dashed line represents a more realistic depiction of the device characteristics with some degree of sub-linearity in the electron branch (positive gate voltage range) and hole branch (negative gate voltage range) due to, for example, scattering and the impact of contacts. The "rounded" behavior of the curve in the Dirac point region is a natural result of a finite voltage drop between source and drain, as well as substrate effects. The illustrated sub-linearity does not harm the frequency tripler application.

FIG. 1b depicts an I-V graph with a generalized "U"-shape which is not desirable.

Figures 1C, 1D:
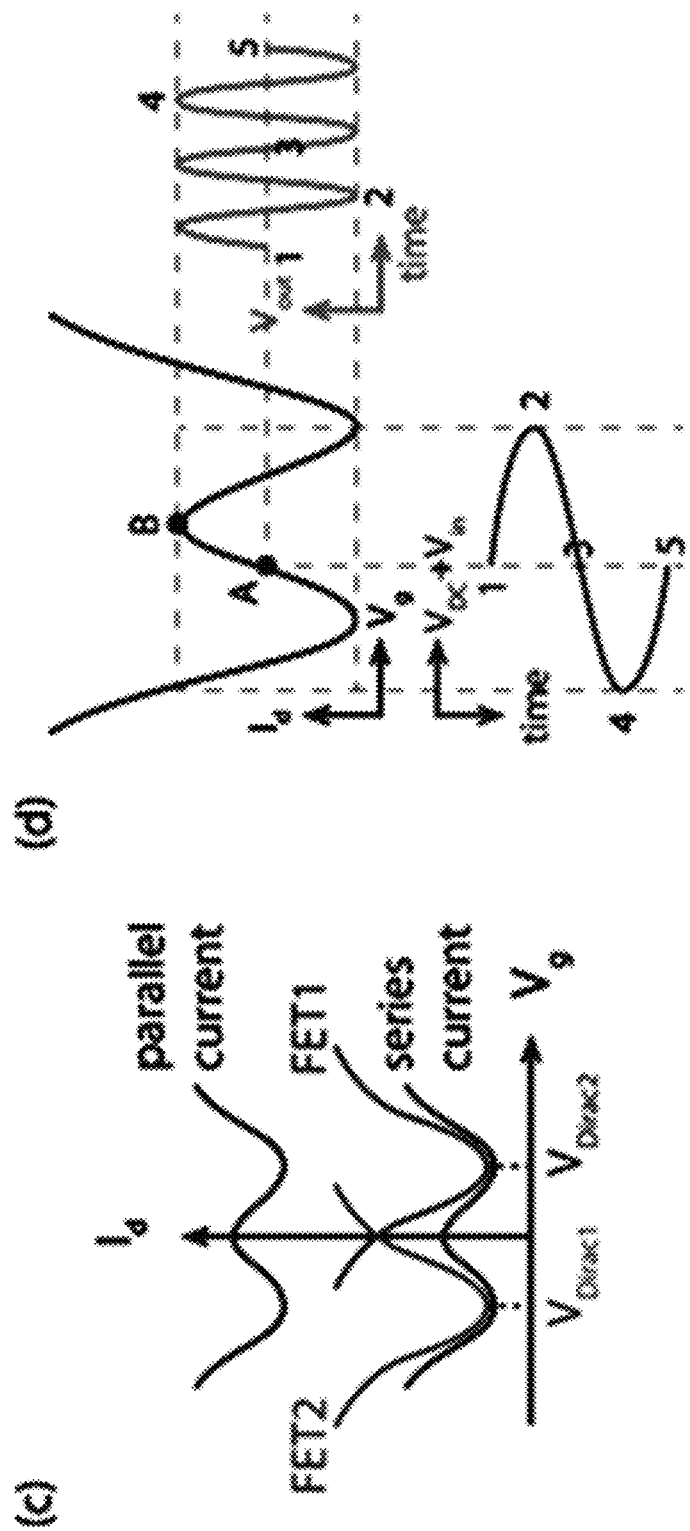
FIG. 1c is a graph of I-V depicting a frequency tripler and an associated "W"-shape I-V characteristic constructed from two graphene FETs with a proper separation of two Dirac voltages the minimum current points in FIG. 1c, according to the present disclosure.
FIG. 1d provides graphs of I-V and voltage vs. time depicting operational principle of a frequency tripler based on the "W"-shaped I-V.

Based on the "V"-shape transfer characteristics of a graphene FET, a "W"-shape I-V can be constructed by utilizing two graphene FETs with properly separated Dirac voltages, as depicted in FIG. 1c. Taking into account circuit implementation concerns, these two graphene FETs can be either connected in series or parallel. This "W"-shaped I-V is one important factor for the realization of the frequency tripler application.

The operational principle is illustrated in the three panels of FIG. 1d. An alternating current (AC) sinusoidal input signal (i.e., the bottom portion of FIG. 1d) carrying the fundamental frequency from which frequency multiple is achieved is biased at point A by a dc voltage ($V_{DC}$) and supplied to the gates of both graphene FETs simultaneously. The amplitude of the input signal is adjusted to generate a voltage swing as indicated in FIG. 1d by the dashed lines. While the input voltage oscillation follows the cycle from point 1 to 5, the current according to the transfer curve varies and generates an oscillating output voltage through a load resistor. The resulting output waveform (the waveform on the right hand side of FIG. 1d), following the corresponding cycle 1 through 5, is distorted from the input waveform such that the third harmonic is generated as the main component in the output spectrum.

Figure 1E:
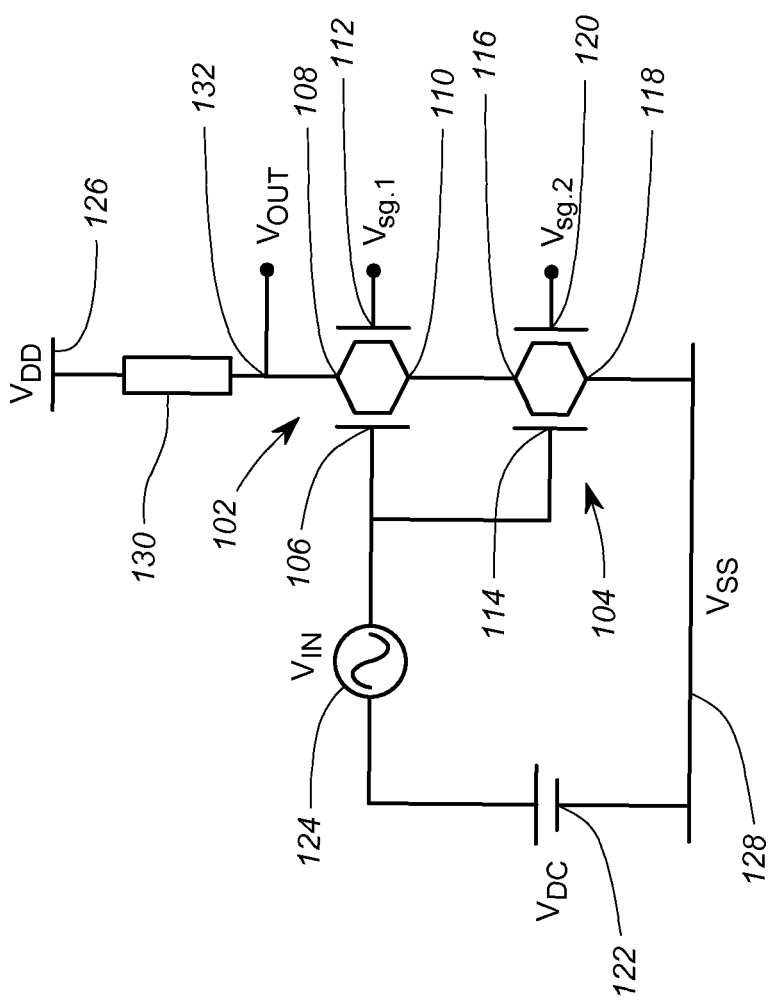
FIG. 1e shows a schematic diagram of an exemplary embodiment of a graphene tripler arrangement.

Referring to FIG. 1e, a schematic diagram of an exemplary embodiment of a graphene tripler arrangement 100 according to the present disclosure is provided. The triple arrangement 100 includes a p-channel top-side FET 102 and an n-channel low-side FET 104. The p-channel top-side FET 102 includes a gate 106, a source 108, a drain 110, and a side gate 112. The n-channel low-side FET 104 includes a gate 114, a source 118, a drain 116, and a side gate 120. The arrangement 100 further includes a DC bias voltage source 122, an input signal source 124, first and second reference voltage sources 126, 128, a resistor 130, and an output 132.

The FETS 102, 104 are connected drain 110 to drain 116 in this embodiment. The source 108 of the p-channel FET 102 is directly coupled to the output 132. The load resistor 130 is operably connected between the reference voltage source 126 and the output 132. The first reference voltage source 126 is in the exemplary embodiment disclosed herein is approximately 4 volts greater than the second reference voltage source 128. The source 118 of the n-channel FET 104 is coupled to the second reference voltage source 128. The output 132 carries the output (tripled frequency) signal $V_{out}$.

The input signal 124 is the source of the signal $V_{in}$ having a first frequency $f_0$ that is tripled by the arrangement 100. In the non-limiting example described herein, the input signal source 124 generated alternating current signals having a primary frequency component of between 200 Hz and 1 kHz. The input signal source 124 is coupled between the second reference voltage source 128 and the gates 106, 114 of the FETs 102, 104. In this embodiment, the DC bias voltage source 122 is coupled between the input signal source 124 and the second reference voltage source 128 to account for the slight asymmetry between the FETs 102, 104. In general 122 can be used to adjust the point of operation A shown in FIG. 1d. The side gates 112, 120 are employed to carry out electrostatic doping in this embodiment, as will be discussed further below in detail. As will be discussed below in connection with FIGS. 2a, 2b, and 2c, however, other doping schemes may suitably be used.

Thus, the two FETs 102, 104 share a common input signal for their respective gates. In the arrangement shown in FIG. 1e, the common gate signal is coupled to $V_{in}$, while the top of the p-channel top side provides $V_{out}$. The device of the graphene tripler 100 are fabricated as described below.

To generate a proper separation between two Dirac voltages (see FIG. 1c), it is necessary to effectively dope the two graphene FETs such that one behaves as a p-type and one as an n-type device. There are several possible doping schemes which may be implemented as illustrated in FIGS. 2a, 2b, and 2c. In FIG. 2a, a substitutional doping scheme is utilized to realize the n-/p-type graphene FETs. Substitutional doping is performed by replacing a small portion of carbon atoms which form the channel in a FET, with foreign dopant atoms. The two carbon channels are shown differently to indicate that two different dopant types reside in each respective channel. After the doping, both FETs are covered with a common top gate dielectric and a top gate metal which receives the input signal. FIG. 2b shows another doping scheme—charge transfer doping. Charge transfer is accomplished by covering the graphene channel with certain types of dielectrics (often organic molecules) which can be used as electron (hole) acceptors. In this way, the graphene adjacent to the charge transfer layer is effectively doped p- (or n-) type. In the schematics, the graphene channels for both FETs are identical but covered with different charge transfer dielectrics represented by different shading. Note that the charge transfer dielectric in FIG. 2b is also used as a top gate dielectric.

FIG. 2c illustrates electrostatic doping, similar to that used in the embodiment of FIG. 1e. The term electrostatic doping is used here to indicate a change of the relative position of the Fermi energy to the graphene band structure by capacitive coupling through applying a fixed DC voltage on the top (or side) gates. In this case, a common bottom gate may be needed to receive the input signal since the top gate voltages are used to create the desired doping profile. A positive (negative) DC voltage effectively dopes graphene into n- (or p-) type. Here both top gate 1 and top gate 2 are of the same metal material but different direct current (DC) voltages are applied. Thus, the top gates in FIG. 2c are equivalent in function to the side gates 112, 120 in FIG. 1e, and the bottom gate of FIG. 2c forms the gates 106, 114 of FIG. 1e.

In addition to the aforementioned approach, the relative position of the Fermi energy can also be adjusted by using top gate metals with different work functions. In this case, the work functions of the top gate metals are utilized to create the desired doping without the need of applying dc gate voltages. Hence the input signal can be electrically connected to both top gate electrodes without involving a common back gate. The metal with relatively large (small) work function effectively dopes graphene into p- (n-) type. Here top gate 1 and top gate 2 in FIG. 2c represent different choices of metal materials.

Figures 3A, 3B:
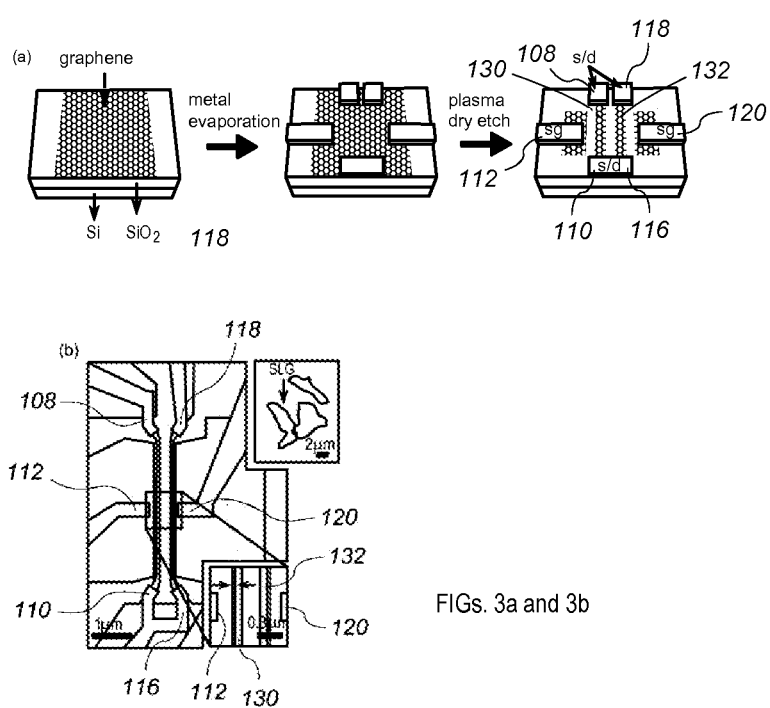
FIGS. 3a and 3b depict processing steps for manufacturing the frequency tripler FET device structure, where 3a shows a schematic of the process flow for device fabrication, and 3b shows how graphene flakes are mechanically exfoliated, followed by electron-beam lithography for metal evaporation and dry etching (where s/d indicates source/drain and sg indicates side gate) and further 3b shows a schematic of the scanning electron micrograph (SEM) image shown in FIG. 4 depicting the fabricated device on the single-layer graphene (SLG) portion of the flake with the zoom-in SEM image illustrating the achieved separation of 40 nm between the side gates and the adjacent channels.

Referring to FIG. 3a an exemplary embodiment of the fabrication process of at least a portion of the arrangement 100 of FIG. 1e is depicted. The device structure of the graphene-based tripler can be constructed first mechanically exfoliating graphene flakes, followed by applying an electron-beam lithography for metal evaporation and followed by dry etching to generate the FET structure including the grapheme-based channels 130, 132 (s/d indicate source/drain; sg indicate side gate). The structures common to FIGS. 3a and 1e bear like reference numbers.

Referring to FIG. 3b, an outline of an optical image (upper right) of an exfoliated graphene flake is provided. An outline of a scanning electron micrograph (SEM) image shows the fabricated device on the single-layer graphene (SLG) portion of the flake with the zoom-in SEM image illustrating a clear separation (see arrows) of 40 nm between the side gates and the adjacent channels 130, 132.

Figure 4:
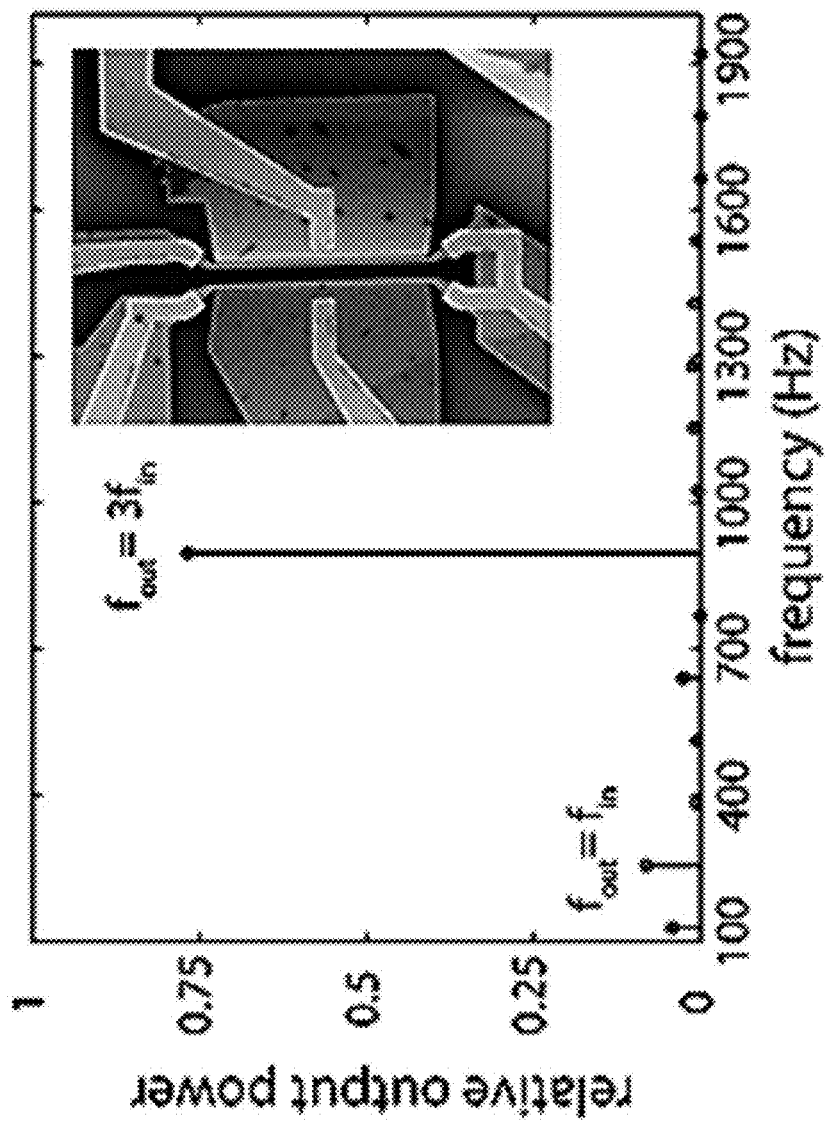
FIG. 4 depicts a graph of relative output power vs. frequency (Hz) for an input frequency of about 300 Hz and an output frequency of about 900 Hz, with the inset showing a scanning electron microscope of a device according to the present disclosure.

FIG. 4 shows an experimental demonstration of the frequency tripler. The inset shows an SEM image of the two graphene FETs connected in series where the common bottom gate is connected to a sinusoidal input signal at 300 Hz. In the SEM image, two graphene in-plane side gates are used to provide electrostatic doping. The measured output spectrum clearly shows that more than 70% of output power is concentrated at the desired 900 Hz.

Those skilled in the art will recognize that numerous modifications can be made to the specific implementations described above. The implementations should not be limited to the particular limitations described. Other implementations may be possible.

The invention claimed is:

1. A frequency tripler device, comprising:
a first graphene based field effect transistor (FET) of a first dopant type, having a gate, a drain, and a source; and
a second graphene based FET of a second dopant type, having a gate, a drain, and a source,
wherein the gate of the first FET coupled to the gate of the second FET and coupled to an input signal having an alternating current (AC) signal component of a first frequency,
the combination of the first and second FETs generate an output signal with a dominant AC signal of a frequency of about three times the first frequency.

2. The frequency triple device of claim 1, where the first and second FETs are generated by one of substitutional doping, charge transfer doping, electrostatic doping, and combinations thereof.

3. A frequency tripler device, comprising:
a first graphene based field effect transistor (FET) of a first dopant type, having a gate, a drain, and a source; and
a second graphene based FET of a second dopant type, having a gate, a drain, and a source,
wherein the gate of the first FET is coupled to the gate of the second FET, and is configured to receive a first signal having a dominant frequency component of a first frequency, and
the combination of the first and second FETs are configured to generate an output signal from the received first signal, the output signal having a dominant frequency component of a second frequency of about three times the first frequency.

4. The frequency tripler device of claim 3, where the first and second FETs are generated by one of substitutional doping, charge transfer doping, electrostatic doping, and combinations thereof.

5. The frequency tripler device of claim 3, wherein a source-drain path of the first FET is serially connected with a source-drain path of the second FET.

6. The frequency tripler device of claim 5, wherein at least the first FET includes a side gate configured to alter an electrostating doping of the first FET responsive to application of a voltage thereto.

7. The frequency tripler device of claim 6, wherein the second FET includes a corresponding side gate configured to alter an electrostating doping the second FET responsive to application of a corresponding voltage thereto.

8. The frequency tripler device of claim 7, wherein the side gate and the corresponding side gate include metals with different work functions.

9. A frequency multiplier device, comprising:
at least a first graphene-based field effect transistor (FET) having a first Dirac voltage, a gate, and drain/source regions; and
at least a second graphene-based FET operably connected to the first graphene-based FET, the second graphene-based FET having a second Dirac voltage different from the first Dirac voltage, the second graphene-based FET having a gate and drain/source regions,
wherein the first Dirac voltage and the second Dirac voltage are configured to have a separation selected to form a transfer characteristic having at least two V-shaped features.

10. The frequency multiplier device of claim 9, wherein the separation of the first Dirac voltage from the second Dirac voltage are formed by employing different doping in the first graphene-based FET and the second graphene-based FET.

11. The frequency multiplier device of claim 10, wherein the different doping in the first and second FETs are generated by one of substitutional doping, charge transfer doping, electrostatic doping, and combinations thereof.

12. The frequency multiplier device of claim 10, wherein a source-drain path of the first graphene-based FET is serially connected with a source-drain path of the second graphene-based FET.

13. The frequency multiplier device of claim 12, wherein at least the first graphene-based FET includes a side gate configured to alter an electrostating doping of the first graphene-based FET responsive to application of a voltage thereto.

14. The frequency multiplier device of claim 13, wherein the second graphene-based FET includes a corresponding side gate configured to alter an electrostating doping the second graphene-based FET responsive to application of a corresponding voltage thereto.

15. The frequency multiplier device of claim 14, wherein the side gate and the corresponding side gate include metals with different work functions.

* * * * *